United States Patent
Kahlman

(10) Patent No.: US 7,877,661 B2
(45) Date of Patent: Jan. 25, 2011

(54) METHOD FOR ENCODING MULTIWORD INFORMATION BY WORDWISE INTERLEAVING AND WORDWISE ERROR PROTECTION WITH ERROR LOCATIVE CLUES DERIVED FROM SYNCHRONIZING CHANNEL BIT GROUPS AND DIRECTED TO TARGET WORDS, A METHOD FOR DECODING SUCH INFORMATION, A DEVICE FOR ENCODING AND/OR DECODING SUCH INFORMATION, AND A CARRIER PROVIDED WITH SUCH INFORMATION

(75) Inventor: Josephus A. H. M. Kahlman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/462,197

(22) Filed: Jun. 16, 2003

(65) Prior Publication Data

US 2003/0208714 A1    Nov. 6, 2003

(51) Int. Cl.
*H03M 13/00* (2006.01)
*G06F 11/00* (2006.01)
(52) U.S. Cl. .................................. 714/752; 714/701
(58) Field of Classification Search ............... 714/704, 714/793, 752, 755, 798, 701; 711/127, 157
See application file for complete search history.

(56) References Cited

U.S. PATENT DOCUMENTS

| 4,559,625 | A | * | 12/1985 | Berlekamp et al. | 714/701 |
| 5,299,208 | A | * | 3/1994 | Blaum et al. | 714/761 |
| 5,511,096 | A | * | 4/1996 | Huang et al. | 375/265 |
| 6,604,217 | B1 | * | 8/2003 | Kahlman | 714/752 |

* cited by examiner

*Primary Examiner*—Christine T. Tu

(57) ABSTRACT

Multiword information is encoded as based on multibit symbols disposed in relative contiguity with respect to a medium. It has wordwise interleaving, wordwise error protection code facilities and error locative clues across words of a multiword group. These originate in synchronizing channel bit groups and target data words.

20 Claims, 2 Drawing Sheets

METHOD FOR ENCODING MULTIWORD INFORMATION BY WORDWISE INTERLEAVING AND WORDWISE ERROR PROTECTION WITH ERROR LOCATIVE CLUES DERIVED FROM SYNCHRONIZING CHANNEL BIT GROUPS AND DIRECTED TO TARGET WORDS, A METHOD FOR DECODING SUCH INFORMATION, A DEVICE FOR ENCODING AND/OR DECODING SUCH INFORMATION, AND A CARRIER PROVIDED WITH SUCH INFORMATION

BACKGROUND OF THE INVENTION

The invention relates to a method as recited in the preamble of claim 1. U.S. Pat. No. 4,559,625 to Berlekamp et al and U.S. Pat. No. 5,299,208 to Blaum et al disclose the decoding of interleaved and error protected information, where an error pattern found in a first word may give a clue to locate errors in another word of the same group of words. Errors pointed at are relatively closer or more contiguous than other symbols of the word that would generate the clue. The references use a standardized format and a fault model with multisymbol error bursts across various words. Occurrence of an error in a particular word may imply a strong probability for an error to occur in a symbol pointed at in a next word or words. The procedure will often raise the number of errors that may be corrected before the mechanism fails.

The present inventor has recognized a problem with this method: a clue will materialize relatively late in the process when the clue originating information will have been demodulated as well as been fully corrected. This will complicate the use of higher level measures such as a retry read of the data during a later disc revolution. Also, the present inventor has recognized that part or all of the clues could be acquired against a lower investment in terms of the amount of redundancy.

SUMMARY TO THE INVENTION

In consequence, amongst other things, it is an object of the present invention to provide a coding format with less overhead that would allow earlier generating of at least part of the clues. Now therefore, according to one of its aspects the invention is characterized according to the characterizing part of claim 1.

The invention also relates to a method for decoding such information, a device for encoding and/or decoding such information, and a carrier provided with such information. Further advantageous aspects of the invention are recited in dependent Claims.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

A clue or a combination of clues, once found, may cause identifying one or more unreliable symbols. Through such identifying, such as by defining erasure symbols, error correction will be made more powerful. Many codes will correct at most t errors when no error locations are known. Given one or more erasure locations, often a larger number e>t of erasures may be corrected. Other types of identifying than characterizing as erasure symbols are feasible. Also the protection against a combination of bursts and random errors may improve. Alternatively, the providing of erasure locations will for a particular fault pattern necessitate the use of only a lower number of syndrome symbols, thus simplifying the calculation. The invention may be used in a storage environment or in a transmission environment.

Figure 1:
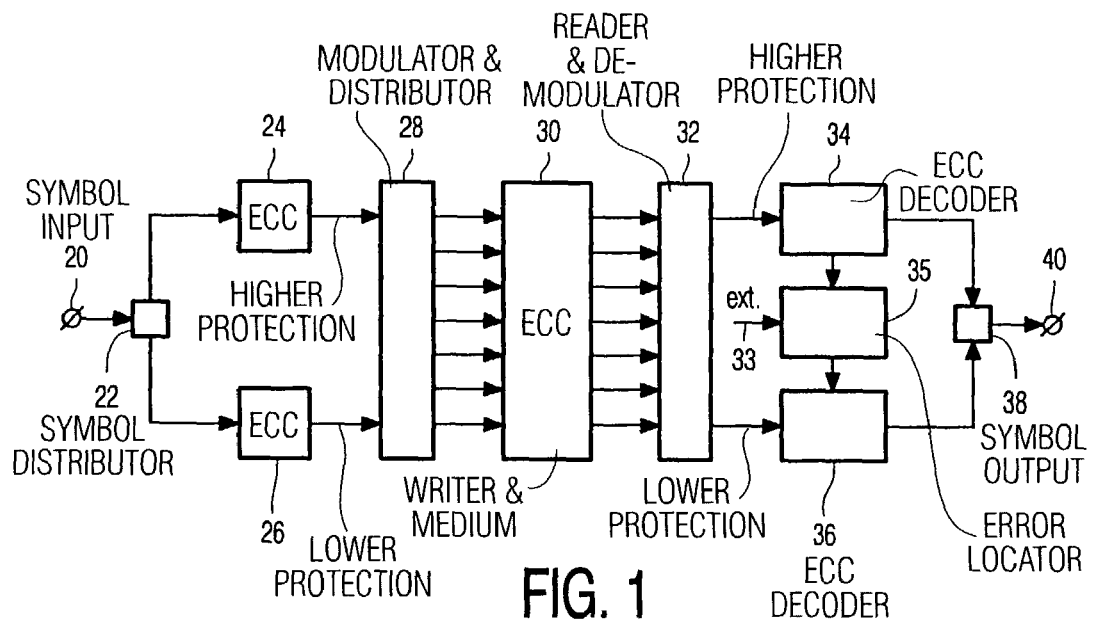
FIG. 1, a system with encoder, carrier, and decoder.

FIG. 1 shows a system according to the invention arranged for producing two types of clues, one deriving from synchronization bit groups and the other from error protected clue words, respectively. The embodiment is used for encoding, storing, and finally decoding a sequence of multibit symbols derived from audio or video signals or from data. Terminal 20 receives successive such symbols that by way of example have eight bits. Splitter 22 recurrently and cyclically transfers symbols intended for the clue words to encoder 24, and all other symbols to encoder 26. In encoder 24 the clue words are formed by encoding the data symbols into code words of a first multi-symbol error correcting code. This code may be a Reed-Solomon code, a product code, an interleaved code, or a combination thereof. In encoder 26 the target words are formed by encoding into code words of a second multi-symbol error correcting code. In the embodiment, all code words will have a uniform length, but this is not necessary. Both codes may be Reed-Solomon codes with the first one being a subcode of the second one. As will be shown in FIG. 4, clue words have a higher degree of error protection.

In block 28, the code words are transferred to one or more outputs of which an arbitrary number has been shown, so that the distribution on a medium to be discussed later will become uniform. Before actual writing on the medium, all code symbols are modulated into channel bits. A well-known modulating rule adheres to a (d,k)=(1,7) constraint, that governs minimum and maximum distances between consecutive signal transitions. The modulating adapts the sequence of channel bits better to the transmission or storage capability of the encoder-medium-decoder string.

Figure 2A:
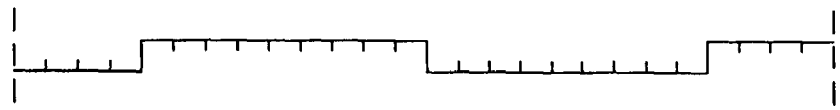
FIGS. 2A-2C, disposition of exemplary sync patterns.

In this respect, FIG. 2A shows an exemplary sync pattern as stored on disc, such as according to a pit/no pit dichotomy. The pattern as shown consists of a sequence of nine no-pit positions followed immediately by a pattern of nine pit positions. Such pattern will violate the standard modulating constraints if k corresponds to a sequence length of less than nine pit/no pit positions. For brevity, the detection signal acquired when scanning such a sequence has been ignored. The whole pattern may be bitwise inverted. The initial and final bit positions of the pattern may be used for other purposes, always provided that transitions may not occur in immediately successive bit positions.

Now in FIG. 1, block 30 symbolizes the unitary medium itself such as tape or disc that receives the encoded data. This may imply direct writing in a write-mechanism-plus-medium combination. Alternatively, the medium may be realized by copying a master encoded medium such as a stamp. In block 32, the channel bits are read again from the medium, followed by immediate demodulating. This will produce recognized sync patterns, as well as code symbols that must be further decoded. Now generally, sync patterns occur on positions where a player device would indeed expect them, leading to the conclusion that synchronization is correct. However, correct sync patterns may be found on unexpected positions. This may indicate loss of synchronism, which must be restored in a tedious process that bases itself on various successive sync patterns received. Generally, synchronization is maintained through a flywheel procedure, or as based on a majority decision among a plurality of successive sync patterns. A correct sync pattern may alternatively be found due to one or more channel bit errors in the data on other positions than intended for sync patterns. Generally, such will be an isolated feature and not lead to a resynchronizing effort. On the other hand, on an expected position the demodulator may fail to find synchronizing pattern. Often, the error will be a random bit that is restorable through inherent redundancy in the synchronizing pattern. This will then lead to a correct sync pattern, and allow to proceed in a standard manner without further considering the restored synchronizing pattern for other channel bits. Alternatively, the error is sufficiently serious as to lead to the conclusion that a burst has been encountered. Such burst may then provide a clue for signalling other symbols in the physical neighbourhood thereof as being erroneous, in the same manner as will hereinafter be discussed with respect to clue words. In principle, the sync-derived clues could be sufficient for enhancing the standard error protectivity. For this purpose, they should be located not too far from each other. If clues are derived from synchronizing patterns as well as from clue words, the synchronizing patterns may be used as a separate mechanism for generating clues even before the start of the decoding of the clue words. This might allow to use two clue mechanisms side by side, one from the synchronizing patterns and one from the clue words. Alternatively, the clues from the synchronizing patterns and from the clue words may be combined. The selecting among the various mechanisms so recited may be done on the basis of a static or dynamic policy. Quite often, the combining with clues found through the decoding of clue words may be used to get a better or more powerful decoding of target words.

After demodulating, the clue words are sent to decoder 34, and decoded as based on their inherent redundancies. As will become apparent in the discussion of FIG. 3 infra, such decoding may present clues on the locations of errors in other than these clue words. Box 35 receives these clues and as the case may be, other indications via arrow 33, and operates on the basis of a stored program for using one or more different strategies to translate clues into erasure locations or other indications for identifying unreliable symbols. The input on line 33 may represent clues produced by the demodulating of the sync bit groups, or as the case may be, other indications such as produced by the general quality of the received signal, such as derived from its frequency spectrum. The target words are decoded in decoder 36. With help from the erasure locations or other identifications, the error protectivity of the target words is raised to a higher level. Finally, all decoded words are multiplexed by means of element 38 conformingly to the original format to output 40. For brevity, mechanical interfacing among the various subsystems has been ignored.

Figure 2B:
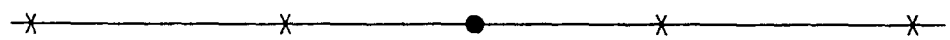
Figure 2C:

FIGS. 2B, 2C illustrate further dispositions of exemplary sync patterns, as distributed in the information stream. Each individual sync pattern may look like FIG. 2A. In the first place, these sync patterns may be the only source for the clue information. They are preferably positioned in periodically spaced locations in the information stream. Alternatively, clues may derive both from the sync patterns and from the clue words. FIGS. 2B, 2C illustrate the latter case. Therein, the positions of the clue word symbols have been indicated by crosses. The positions of the sync bit groups have been indicated by dots. In FIGS. 2B, 2C, distances between clue word symbols are higher at the location of the sync bit group shown than elsewhere, so that they are locally scarcer. In FIG. 2A their distance is less than twice its value elsewhere. In FIG. 2B it is equal to twice its value elsewhere. Other distributions are feasible.

Figure 3:
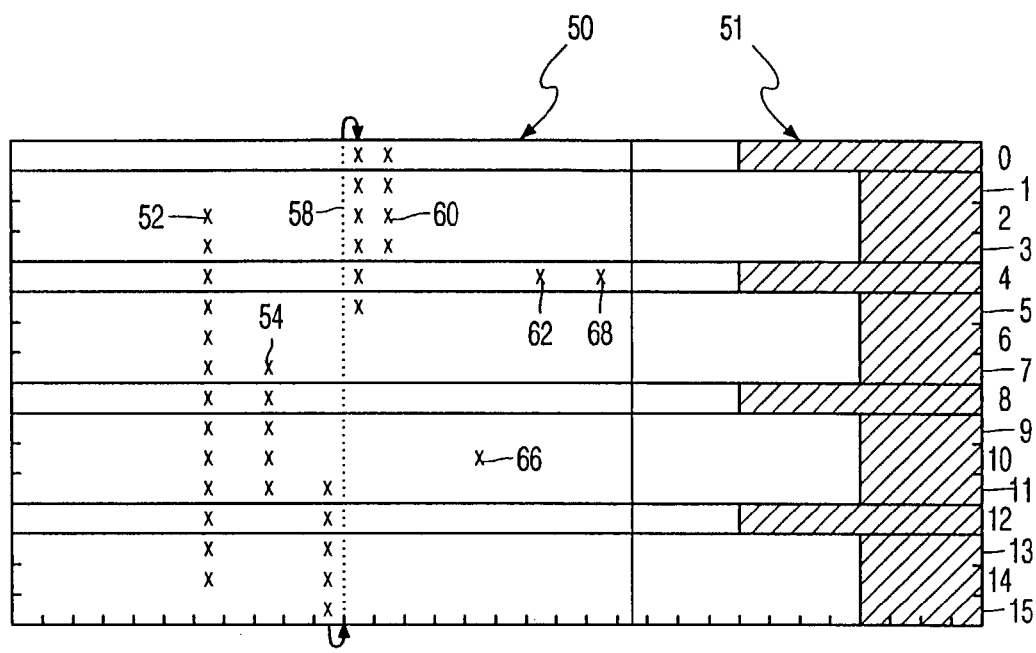
FIG. 3, a code format principle.

FIG. 3 illustrates a simple code format without contribution by the sync bit groups. The coded information of 512 symbols has been notionally arranged in a block of 16 rows and 32 columns. On-medium storage is serially column-by-column starting at the top left. The hatched region contains check symbols, and clue words 0, 4, 8, and 12 have 8 check symbols each. The target words contain 4 check symbols each. The whole block contains 432 information symbols and 80 check symbols. The latter may be localized in a more distributed manner over their respective words. A part of the information symbols may be dummy symbols. The Reed-Solomon code allows to correct in each clue word up to four symbol errors. Actually present symbol errors have been indicated by crosses. In consequence, all clue words may be decoded correctly, inasmuch as they never have more than four errors. Notably words 2 and 3 may however not be decoded on the basis of their own redundant symbols only. Now, in FIG. 3 all errors, except 62, 66, 68 represent error strings, but only strings 52 and 58 cross at least three consecutive clue words. These are considered as error bursts and cause erasure flags in all intermediate symbol locations. One or more target words before the first clue word error of the burst and one or more target words just after the last clue symbol of the burst may also get an erasure flag, depending on strategy. String 54 is too short to be considered a burst.

Therefore, two of the errors in word 4 produce an erasure flag in the associated columns. This renders words 2 and 3 correctable, each with a single error symbol and two erasure symbols. However, random errors 62, 68, nor string 54 constitute clues for words 5, 6, 7, because each of them contains only a single clue word. Sometimes, an erasure may result in a zero error pattern, because an arbitrary error in an 8-bit symbol has a $\frac{1}{256}$ probability to cause a correct symbol. Likewise, a burst crossing a particular clue word may produce a correct symbol therein. A bridging strategy between preceding and succeeding clue symbols of a single burst may incorporate this correct symbol into the burst, and in the same manner as erroneous clue symbols may translate it into erasures for appropriate target symbols.

DISCUSSION OF A PRACTICAL FORMAT

Practising the invention applies to new methods for digital optical storage. At present, substrate incident reading may have a transmissive layer as thin as 100 micron. Channel bits may have a size of some 0.14 microns, so a data byte at a channel rate of 2/3 will have a length of only 1.7 microns. At the top surface the beam has a diameter of 125 microns. Enveloping the disc in a so-called caddy will reduce the probability of large bursts. However, non-conforming particles of less than 50 microns may cause short faults. Developers have used a fault model wherein such faults through error propagation may lead to bursts of 200 microns, corresponding to some 120 Bytes. The model proposes fixed size bursts of 120B that start randomly with a probability per byte of $2.6*10^{-5}$, or on the average one burst per 32 kB block. The inventor envisages serial storage on optical disc, but configurations such as multitrack tape, and other technologies such as magnetic and magneto-optical would benefit from the improved approach herein.

Figure 4:
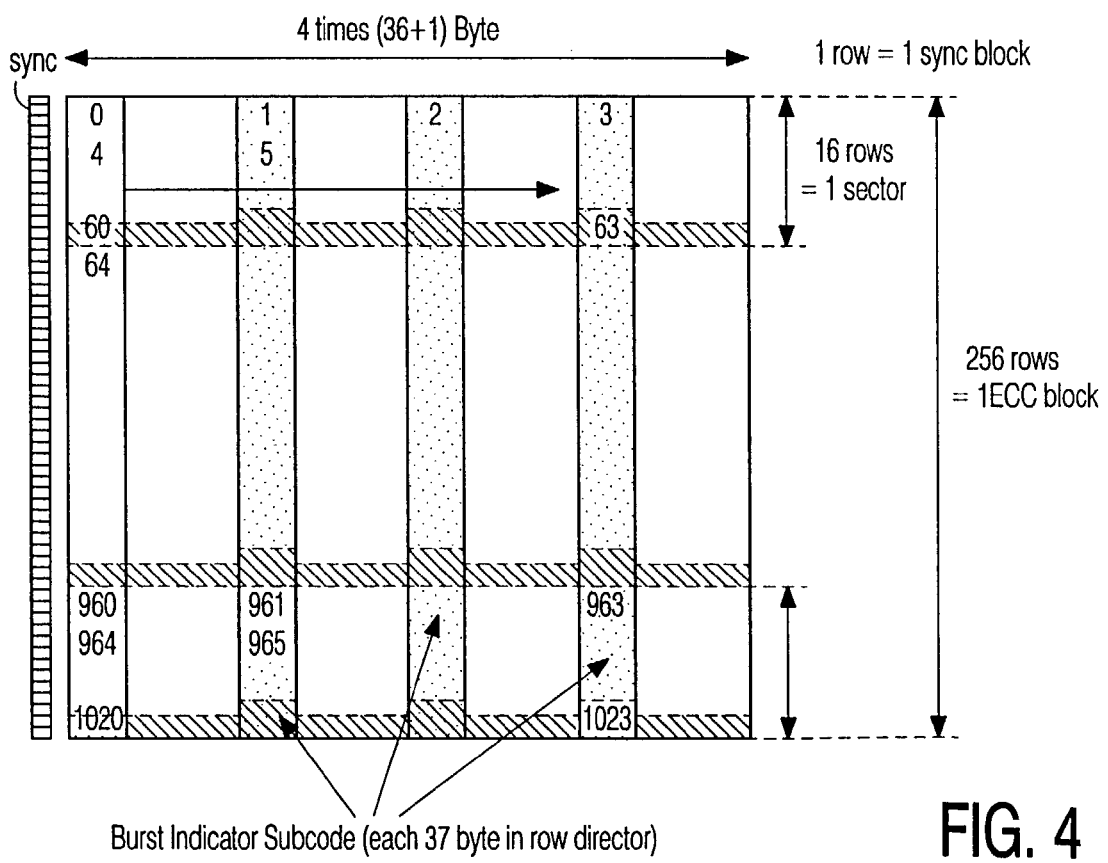
FIG. 4, a picket code and burst indicator subcode.

FIG. 4 shows a picket code and burst indicator subcode. A picket code consists of two subcodes A and B. The Burst Indicator Subcode contains the clue words. It is formatted as a deeply interleaved long distance code that allows to localize the positions of the multiple burst errors. The error patterns so found are processed to obtain erasure information for the target words that are configured in the embodiment as a Product Subcode. The latter will correct combinations of multiple bursts and random errors, by using erasure flags obtained from the burst indicator subcode. The indicators provided by the sync bit groups may be used in isolation, or in combination with the indications from the clue words. Generally, if no due words had been provided at all, the number of synchronizing bit groups will be raised. The developing of the clues will be similar to the procedure sketched with reference to FIG. 3 for the clue words.

The following format is proposed:
the block of 32 kB contains 16 DVD-compatible sectors
each such sector contains 2064=2048+16 Bytes data
each sector after ECC encoding contains 2368 Bytes
therefore, the coding rate is 0.872
in the block, 256 sync blocks are formatted as follows
each sector contains 16 sync blocks
each sync block consists of 4 groups of 37 B
each group of 37 B contains 1 B of deeply interleaved Burst Indicator Subcode and 36 B of Product Subcode.

In FIG. 4, rows are read sequentially, each starting with its leading sync pattern. Each row contains 3 Bytes of the BIS shown in grey, numbered consecutively, and spaced by 36 other Bytes. Sixteen rows form one sector and 256 rows form one sync block. Overall redundancy has been hatched. The synchronization bytes may be used to yield clues, through redundancy therein outside the main code facilities. The hardware arrangement of FIG. 1 may execute the processing of the synchronization bit groups that constitute words of another format than the data bytes in a preliminary operation step. Still further information may indicate certain words or symbols as unreliable, such as from the quality of the signal derived from the disc or through demodulation errors. Note that in FIG. 4 one column at left is now no longer necessary for the clue words of the burst indicator subcode BIS. As shown, this column if filled with target words. Alternatively, the column is left out completely. In both cases, the next storage density for user data is increased.

The sync bit group is a good vehicle for detecting bursts through its inherently large Hamming distance from most burst-inflicted patterns. A typical spacing between sync bit groups could be about 1000 channel bits. A different format is to split a 24-bit sync bit pattern into two halves of twelve bits each, that each violate the modulation principle only once. The spacing between sync bit groups is then also halved to about 500 bits, so that overhead remains the same. It is possible to exclusively use predetermined bit fractions from the sync bit group for burst detection. Note that in FIG. 3, the sync bit group would occupy a horizontal row above the first clue word position.

The invention claimed is:

1. A method for encoding multiword information that is based on multibit symbols disposed in relative contiguity with respect to a medium, whilst providing wordwise interleaving and wordwise error protection code facilities and furthermore providing error locative clues across words of a multiword group,
characterized by originating first such clues in synchronizing channel bit groups and targeted to data words.

2. A method as claimed in claim 1, wherein said synchronizing bit groups are reposed in locally scarcer disposed further clue originators derived from unmodulated symbols.

3. A method as claimed in claim 2, wherein said further clue originators comprise high protectivity clue words that are directed to low protectivity target words.

4. A method as claimed in claim 1, wherein a particular synchronizing channel bit group when uninterfered with will violate a channel modulation rule applying to other channel bit groups.

5. A method for decoding multiword information that is based on multibit symbols disposed in relative contiguity with respect to a medium, whilst effecting wordwise deinterleaving and deriving wordwise error locative clues across words of a multiword group,
characterized by deriving first such clues from synchronizing channel bit groups as being directed to data words.

6. A method as claimed in claim 5, further characterized by whilst deriving additional error locative clues from demodulated words with symbols locally scarcer disposed around such synchronizing channel bit groups than elsewhere.

7. A method as claimed in claim 5, characterized by whilst deriving additional error locative clues from demodulated words outside such synchronizing bit groups, and using first and second clues in a cooperative manner.

8. A method as claimed in claim 5, characterized by whilst deriving additional error locative clues from demodulated high protectivity clue words outside such synchronizing bit groups, and directed to low protectivity target words.

9. A device for encoding multiword information that is based on multibit symbols disposed in relative contiguity with respect to a medium, comprising wordwise interleaving means, wordwise error protection encoding means and generating means for generating error locative clues across words of a multiword group,
characterized in that said generating means impose first such clues in synchronizing channel bit groups and targeted to data words.

10. A device as claimed in claim 9, wherein said interleaving and encoding means are arranged for reposing said synchronizing bit groups among locally scarcer disposed further clue originators to derive from unmodulated symbols.

11. A method as claimed in claim 10, wherein said further clue originators comprise high protectivity clue words directing to low protectivity target words.

12. A device as claimed in claim 9, wherein a particular synchronizing channel bit group when uninterfered with will violate a channel modulation rule applying to other channel bit groups.

13. A device for decoding multiword information based on multibit symbols disposed in relative contiguity with respect to a medium, comprising wordwise deinterleaving means, wordwise error decoding means and locating means for deriving wordwise error locative clues across words of a multiword group,
characterized in that first such clues derive from synchronizing channel bit groups as directing to data words.

14. A device as claimed in claim 13, wherein said decoding means are arranged for deriving additional error locative clues from at least one demodulated clue words with symbols locally scarcer disposed near such synchronizing channel bit groups than elsewhere.

15. A device as claimed in claim 13, wherein said decoding means are arranged for deriving additional error locative clues from demodulated words outside such synchronizing bit groups, and to use first and second clues in a cooperative manner.

16. A device as claimed in claim 13, wherein said decoding means are arranged for deriving additional error locative clues from demodulated high protectivity clue words outside such synchronizing bit groups, and directed to low protectivity target words.

17. A carrier comprising multiword information that is based on multibit symbols disposed in relative contiguity with respect to a medium, having wordwise interleaving, wordwise error protection code facilities and error locative clues across words of a multiword group, characterized in that first such clues originate in synchronizing channel bit groups and will target data words.

18. A carrier as claimed in claim 17, wherein said synchronizing bit groups are reposed among locally scarcer disposed further clue originators to derive from demodulated symbols.

19. A carrier as claimed in claim 17, wherein said further clue originators comprise high protectivity clue words that are directed to low protectivity target words.

20. A carrier as claimed in claim 17, wherein a particular synchronizing channel bit group when uninterfered with will violate a channel modulating rule applying to other channel bit groups.

* * * * *